(12) United States Patent
Wu

(10) Patent No.: US 12,292,675 B2
(45) Date of Patent: May 6, 2025

(54) HEAT-DISSIPATING MODULE AND PROJECTION DEVICE

(71) Applicant: Coretronic Corporation, Hsin-Chu (TW)

(72) Inventor: Pei-Rong Wu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 523 days.

(21) Appl. No.: 17/855,819

(22) Filed: Jul. 1, 2022

(65) Prior Publication Data
US 2023/0004076 A1    Jan. 5, 2023

(30) Foreign Application Priority Data

Jul. 2, 2021  (CN) .......................... 202121496939.3

(51) Int. Cl.
*G03B 21/16* (2006.01)
*H05K 7/20* (2006.01)

(52) U.S. Cl.
CPC ......... *G03B 21/16* (2013.01); *H05K 7/20336* (2013.01); *H05K 7/2039* (2013.01)

(58) Field of Classification Search
CPC .. G03B 21/16; H04N 9/3144; H05K 7/20336; H05K 7/2039
See application file for complete search history.

(56) References Cited

U.S. PATENT DOCUMENTS 10,620,516 B2    4/2020  Wu et al.
2021/0348857 A1*  11/2021  Wang .................. H01L 23/3672

FOREIGN PATENT DOCUMENTS

| CN | 2590170 | 12/2003 |
|---|---|---|
| CN | 201306965 | 9/2009 |
| TW | I635352 | 9/2018 |

* cited by examiner

*Primary Examiner* — Ryan D Howard
(74) *Attorney, Agent, or Firm* — JCIPRNET

(57) ABSTRACT

A heat-dissipating module including heat-dissipating fins and heat pipes is provided. The heat-dissipating fins include first and second heat-dissipating fins arranged in an interleaved, spaced apart manner, and arranged in parallel along a first direction. The first heat-dissipating fins have interleaved first vias and first breach holes. The second heat-dissipating fins have interleaved second vias and second breach hole. The first breach holes and the second breach holes are arranged along a second direction, and the second vias respectively correspond to the first vias. The first direction is not parallel to the second direction. The heat pipes are configured to pass through the first vias and the second vias. A position of the orthogonal projection of a first breach hole formed on the second heat-dissipating fins along the first direction and the corresponding second breach hole are not overlap or are partially overlapped, and are arranged in symmetry.

20 Claims, 8 Drawing Sheets

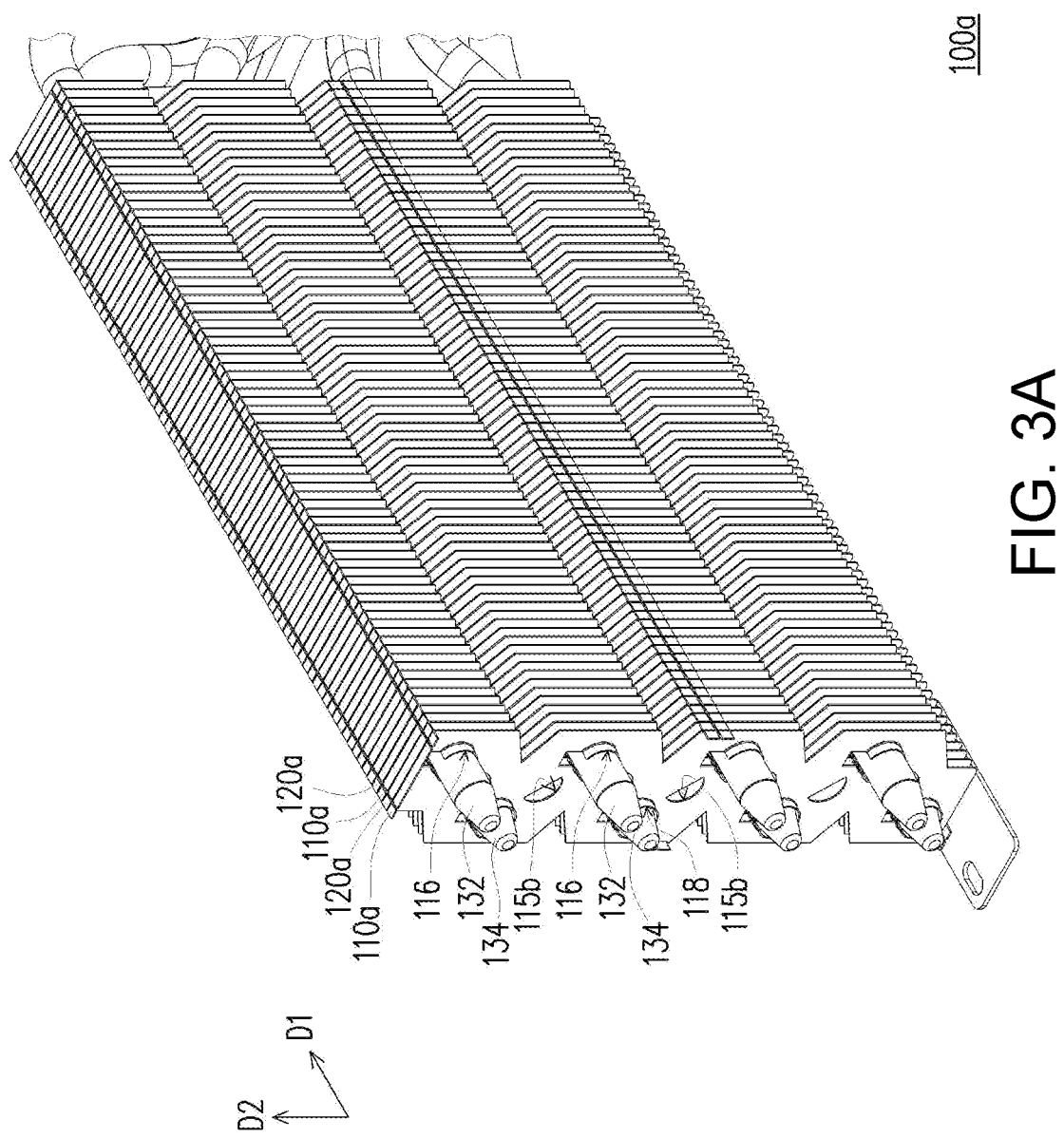

HEAT-DISSIPATING MODULE AND PROJECTION DEVICE

CROSS-REFERENCE TO RELATED APPLICATION

This application claims the priority benefit of China application serial no. 202121496939.3, filed on Jul. 2, 2021. The entirety of the above-mentioned patent application is hereby incorporated by reference herein and made a part of this specification.

BACKGROUND

Technical Field

The invention relates to a heat-dissipating module and a projection device, and in particular to a heat-dissipating module with good heat-dissipation effect and a projection device using this heat-dissipating module.

Description of Related Art

A traditional air-cooled heat-dissipation method is becoming incapable of meeting current needs due to the high brightness and high power consumption of many electronic elements, so it is necessary to use a heat-dissipating module to improve heat-dissipation efficiency. A current heat-dissipating module is designed to be mainly formed of a metal diffusion structure and fins. The surface of the fins has no structural design; that is, the surface of the fins is a complete plane. Heat generated by a heating element may be diffused to a larger area through a thermal diffusion structure, and then the heat may be transferred to the fins through a heat transferring structure or may be directly transferred to the fins, and the heat is removed through natural convection or forced convection through air flow generated by a fan. However, in response to low noise requirements, it is necessary to increase the volume of the heat-dissipating module of a forced cooling device. The increased volume causes a product to become heavier, and problems such as lack of mobility or increased risk of installation also exist, creating inconvenience for users.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention provides a heat-dissipating module, which has good heat-dissipation efficiency.

The invention also provides a projection device, which includes the heat-dissipating module as described above. The invention reduces flow resistance and increases flow rate under the system state of same heat and fan speed, thereby improving heat-dissipation and achieving a light-weight projection device.

Other purposes and advantages of the invention can be further understood from the technical features disclosed in the invention.

In order to achieve one or part or all of the above objectives or other objectives, an embodiment of the invention proposes a heat-dissipating module including multiple heat-dissipating fins and multiple heat pipes. The heat-dissipating fins include multiple first heat-dissipating fins and multiple second heat-dissipating fins. The first heat-dissipating fins and the second heat-dissipating fins are disposed in an interleaved manner and are spaced apart from each other and arranged in parallel in a first direction. Each of the first heat-dissipating fins has multiple first vias and multiple first breach holes. The first vias and the first breach holes are arranged in an interleaved manner, and the first breach holes are arranged along a second direction, and the first direction is not parallel to the second direction. Each of the second heat-dissipating fins has multiple second vias and multiple second breach holes. The second vias and the second breach holes are arranged in an interleaved manner, and the second breach holes are arranged along the second direction, and the second vias respectively correspond to the first vias of the first heat-dissipating fins. The heat pipes are configured to pass through the first vias of the first heat-dissipating fins and the second vias of the second heat-dissipating fins along the first direction. Any of the first breach holes forms an orthogonal projection on the second heat-dissipating fins along the first direction, and a position of the orthogonal projection and a position of the corresponding second breach hole among the second breach holes are not overlapped or are partially overlapped, and are arranged in symmetry.

In order to achieve one or part or all of the above objectives or other objectives, an embodiment of the invention proposes a projection device including a case, a light source, an optical engine module, and a heat-dissipating module. The light source and the optical engine module are disposed in the case, and the optical engine module includes a light valve and a projection lens. The light source is configured to provide an illumination light beam to the optical engine module. The light valve is disposed on a transmission path of the illumination light beam and is configured to convert the illumination light beam into an image beam. The projection lens is disposed on a transmission path of the image beam and is configured to project the image beam to the outside of the projection device. The heat-dissipating module is disposed in the case, and the heat-dissipating module includes multiple heat-dissipating fins and multiple heat pipes. The heat-dissipating fins include multiple first heat-dissipating fins and multiple second heat-dissipating fins. The first heat-dissipating fins and the second heat-dissipating fins are disposed in an interleaved manner and are spaced apart from each other and arranged in parallel in a first direction. Each of the first heat-dissipating fins has multiple first vias and multiple first breach holes. The first vias and the first breach holes are arranged in an interleaved manner, and the first breach holes are arranged along a second direction, and the first direction is not parallel to the second direction. Each of the second heat-dissipating fins has multiple second vias and multiple second breach holes. The second vias and the second breach holes are arranged in an interleaved manner, and the second breach holes are arranged along the second direction, and the second vias respectively correspond to the first vias of the first heat-dissipating fins. The heat pipes are configured to pass through the first vias of the first heat-dissipating fins and the second vias of the second heat-dissipating fins along the first direction. Any of the first breach holes forms an orthogonal projection on the second heat-dissipating fins along the first direction, and a position of the orthogonal projection and a position of the corresponding second breach hole among the second breach holes are not overlapped or are partially overlapped, and are arranged in symmetry.

Based on the above, the invention's embodiments at least have one of the following advantages or effects. In the design of the heat-dissipating module of the invention, the first heat-dissipating fins and the second heat-dissipating fins respectively have the design of first breach holes and second breach holes. Any first breach hole forms an orthogonal projection on the second heat-dissipating fins along the first direction, and the position of the orthogonal projection and the position of the corresponding second breach hole are not overlapped or are partially overlapped, and are arranged in symmetry. In this way, when air flow passes through the heat-dissipating fins, the additional conduction path of the air flow is created, so that the flow resistance is reduced and the flow rate is increased under the system state of the same heat and fan speed, thereby improving the efficiency of heat-dissipation of the heat-dissipating module of the invention. In addition, when the projection device of the heat-dissipating module of this embodiment is being used, because of the design of the heat-dissipating fins' break holes and vias, heat-dissipation efficiency is improved and a lightweight projection device is achieved.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A is a schematic perspective view of a heat-dissipating module according to another embodiment of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention may be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
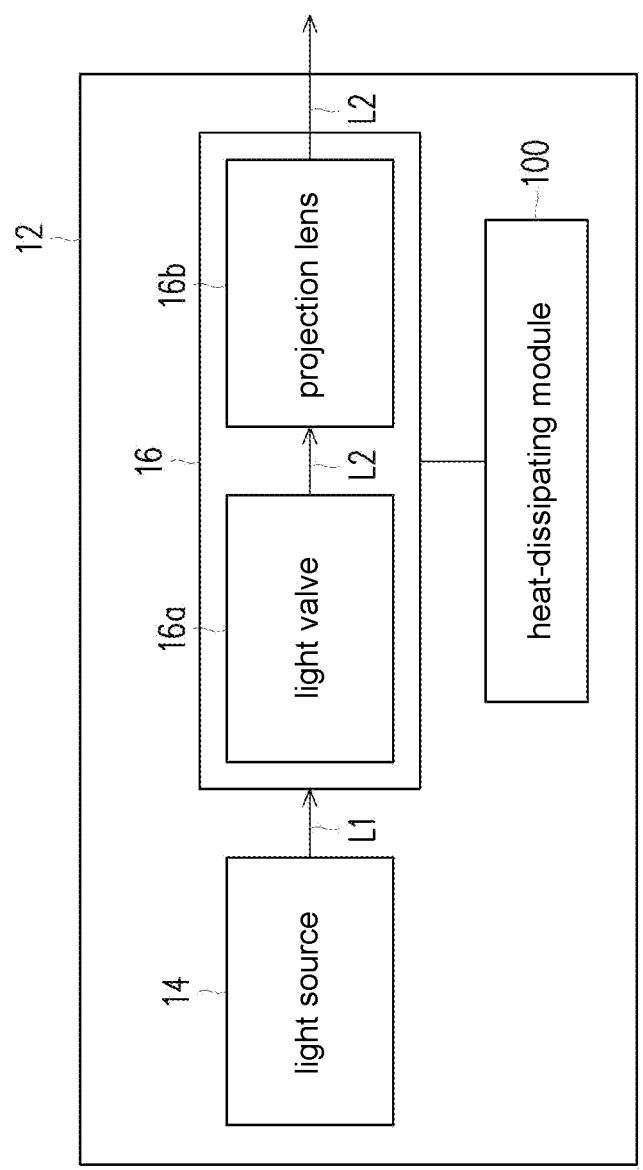
FIG. 1 is a schematic diagram of a projection device according to an embodiment of the invention.

FIG. 1 is a schematic diagram of a projection device according to an embodiment of the invention. Referring to FIG. 1, in this embodiment, a projection device 10 includes a case 12, a light source 14, an optical engine module 16, and a heat-dissipating module 100. The light source 14 and the optical engine module 16 are disposed in the case 12, and the optical engine module 16 includes a light valve 16a and a projection lens 16b. The light source 14 is used to provide an illumination light beam L1 to the optical engine module 16. The light valve 16a is disposed on the transmission path of the illumination light beam L1 and is used to receive the illumination light beam L1 and convert the illumination light beam L1 into an image beam L2. The projection lens 16b is disposed on the transmission path of an image beam L2 and is used to project the image beam L2 from the light valve 16a to the outside of the projection device 10. In other words, the light source 14 is used to output the illumination light beam L1. After being converted by the light valve 16a, the illumination light beam is projected to a display screen (not shown) outside the projection device 10 through the projection lens 16b. Here, the light source 14 includes, for example, a light emitting element (not shown), such as a light emitting diode, a laser diode, a high-pressure mercury lamp, or other appropriate light emitting elements. The heat-dissipating module 100 is disposed in the case 12 and is connected to the optical engine module 16. In another embodiment, the heat-dissipating module 100 may be connected to the light source 14, and the invention is not limited thereto.

Specifically, the light valve 16a used in this embodiment is, for example, a reflective light modulator such as a liquid crystal on silicon panel (LCoS panel), a digital micro-mirror device (DMD). In an embodiment, the light valve 16a is, for example, a penetrating optical modulator such as a transparent liquid crystal panel, an electro-optical modulator, a magneto-optic modulator, an acousto-optic modulator (AOM), but this embodiment does not limit the type of the light valve 16a. The detailed steps and implementation methods of the method of the light valve 16a modulating the illumination light beam L1 into the image beam L2 may be obtained from general knowledge in the technical field with sufficient teaching, suggestion, and implementation description, so details thereof will not be repeated herein. In addition, the projection lens 16b, for example, includes a combination of one or more optical lenses with a diopter, such as various combinations of non-planar lenses including a bi-concave lens, a bi-convex lens, a meniscus lens, a convex-concave lens, a plano-convex lens, and a plano-concave lens. In an embodiment, the projection lens 16b may include a flat optical lens to project the image beam L2 from the light valve 16a out of the projection device 10 through reflection or penetration. Here, the embodiment does not limit the type of the projection lens 16b.

Figure 2A:
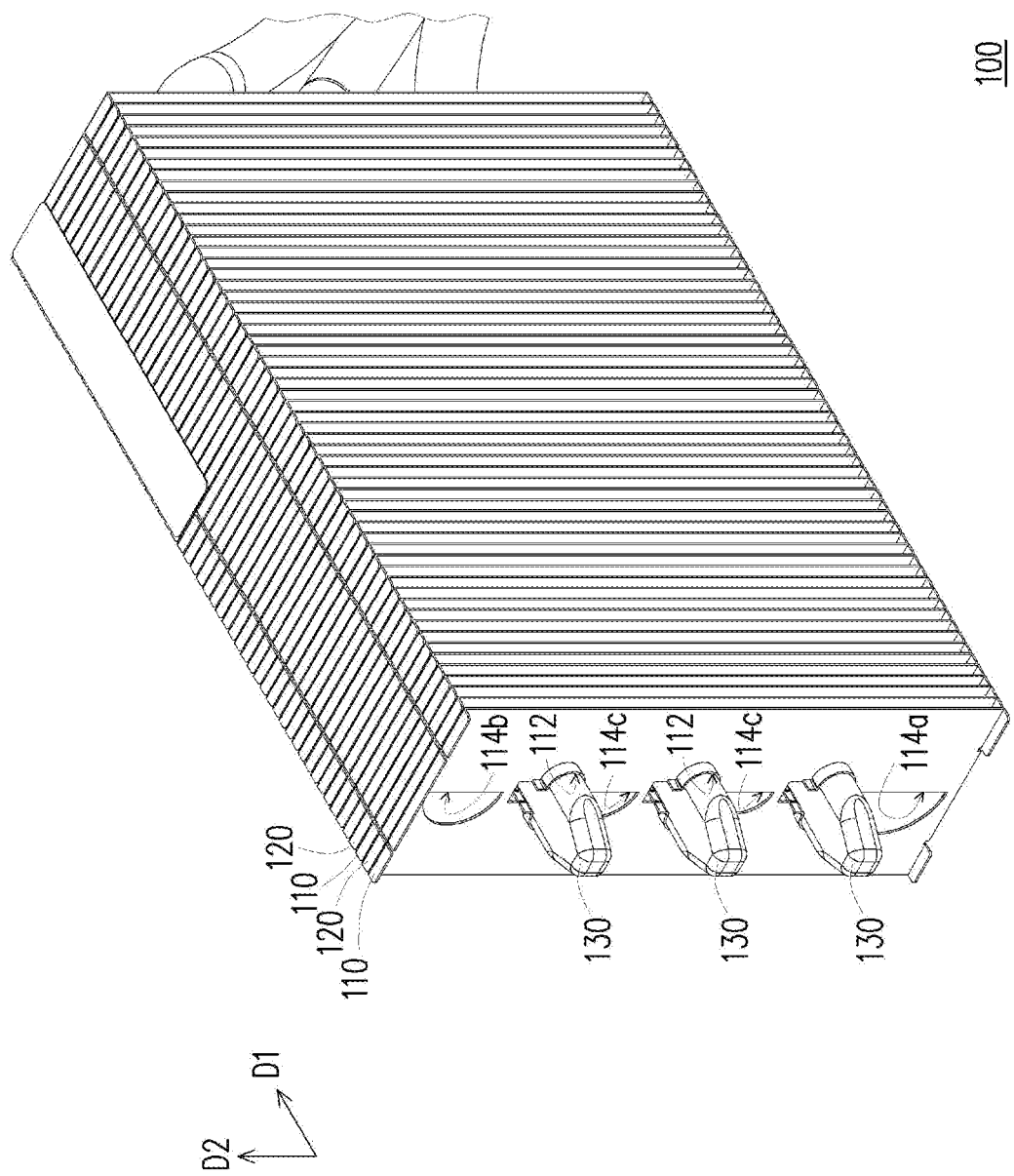
FIG. 2A is a schematic perspective view of a heat-dissipating module in the projection device of FIG. 1.
Figure 2B:
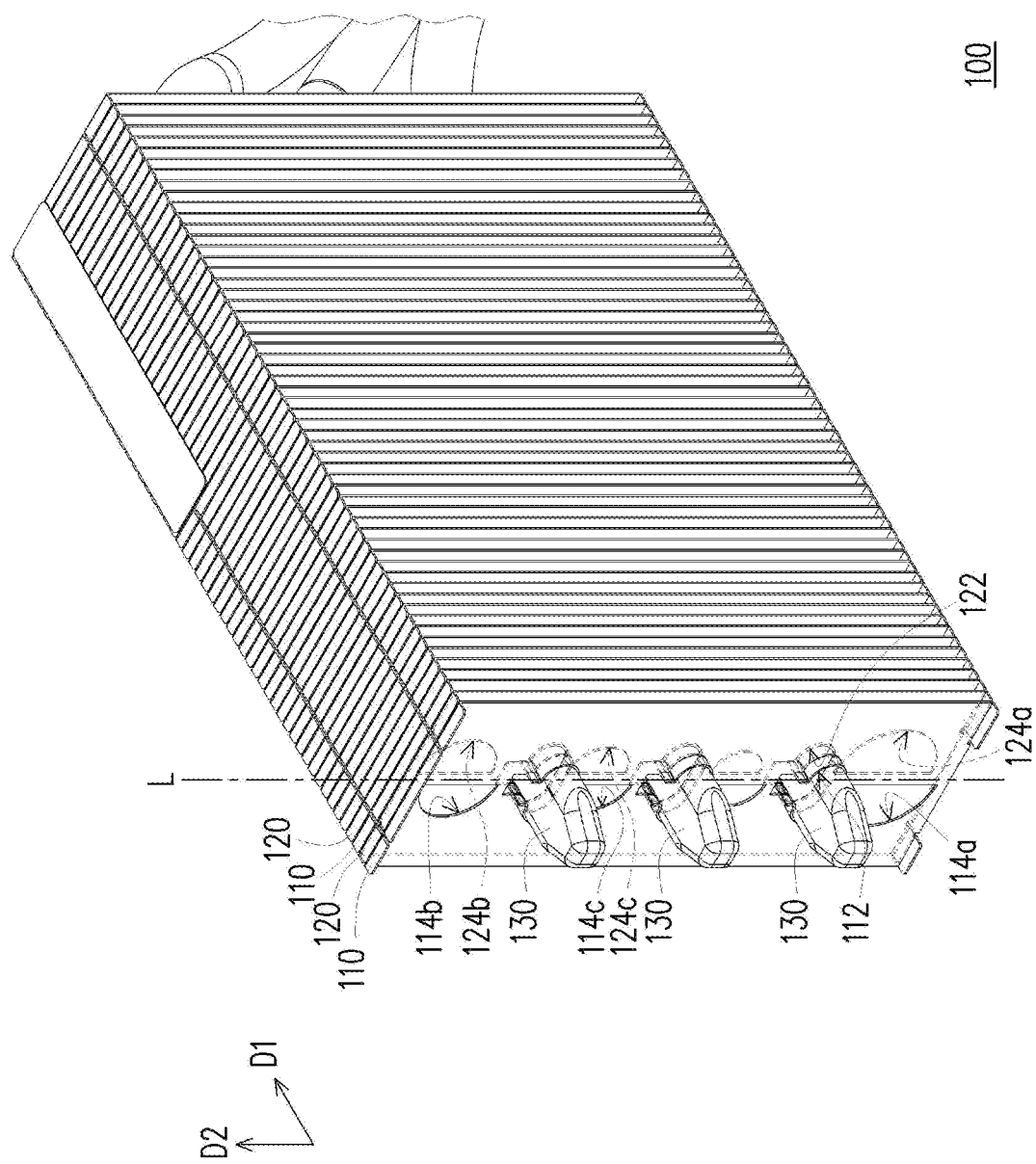
FIG. 2B is a schematic perspective view of a portion of the heat-dissipating module of FIG. 2A.
Figure 2D:
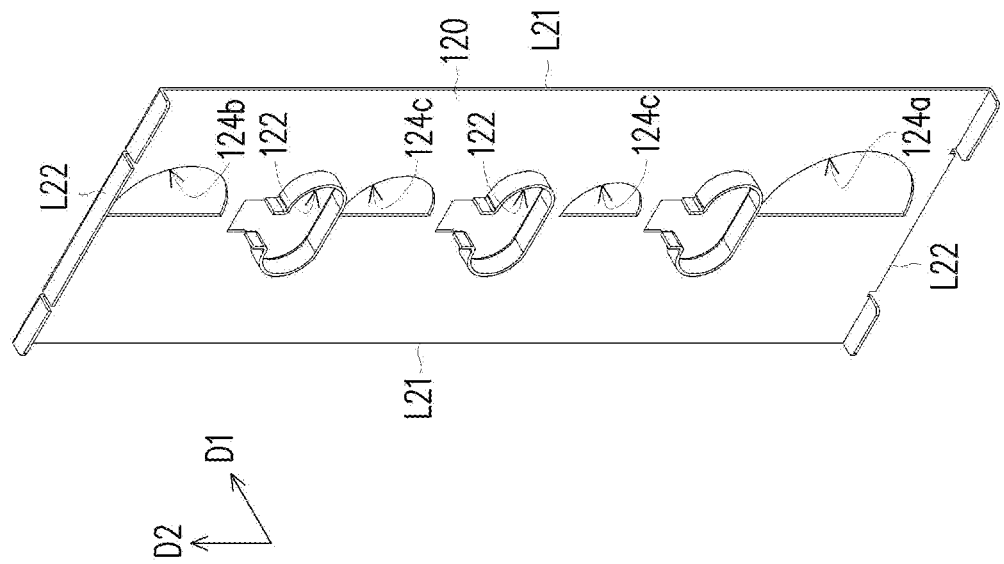
FIG. 2D is a schematic perspective view of a second heat-dissipating fin of the heat-dissipating module in FIG. 2A.
Figure 2C:
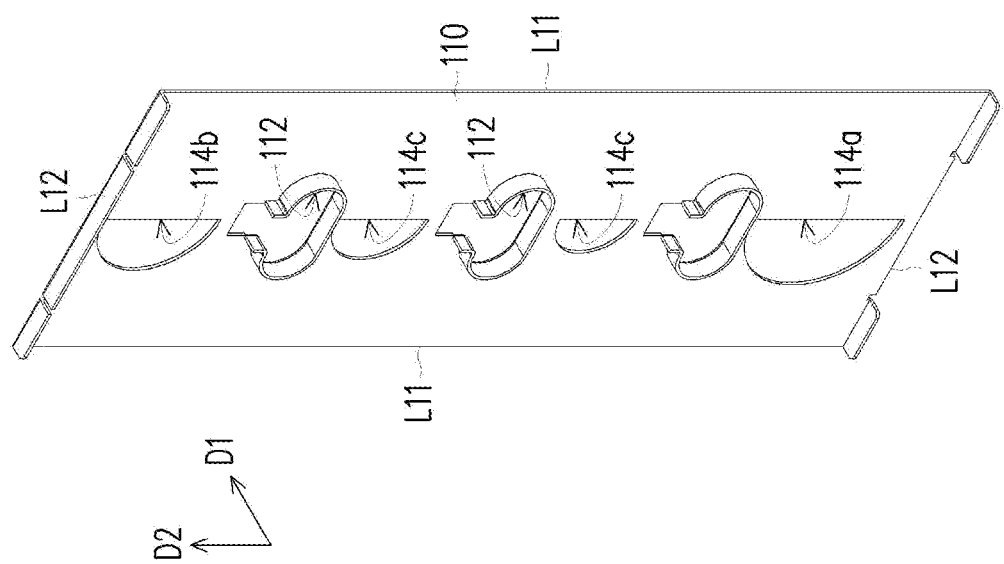
FIG. 2C is a schematic perspective view of a first heat-dissipating fin of the heat-dissipating module of FIG. 2A.

FIG. 2A is a schematic perspective view of a heat-dissipating module in the projection device of FIG. 1. FIG. 2B is a schematic perspective view of a portion of the heat-dissipating module of FIG. 2A. FIG. 2C is a schematic perspective view of a first heat-dissipating fin of the heat-dissipating module of FIG. 2A. FIG. 2D is a schematic perspective view of a second heat-dissipating fin of the heat-dissipating module in FIG. 2A. Referring to FIGS. 2A and 2B, in this embodiment, the heat-dissipating module 100 includes a plurality of heat-dissipating fins and a plurality of heat pipes 130, and the heat-dissipating fin includes a plurality of first heat-dissipating fins 110 and a plurality of second heat-dissipating fins 120. The first heat-dissipating fins 110 and the second heat-dissipating fins 120 are disposed in an interleaved manner and are spaced apart from each other and arranged in parallel along a first direction D1; that is, one first heat-dissipating fins 110, one second heat-dissipating fins 120, one first heat-dissipating fins 110, and one second heat-dissipating fins 120 are disposed in an interleaved manner accordingly. Here, one end of the heat pipe 130 of the heat-dissipating module 100 is connected to the heat-dissipating fins, and the other end of the heat pipe 130 may be connected to the light source 14 (referring to FIG. 1) or the optical engine module 16a (referring to FIG. 1).

Referring to FIG. 2C, each of the first heat-dissipating fins 110 of this embodiment has a plurality of first vias 112 and a plurality of first breach holes 114a, 114b, and 114c. The first vias 112 and the first breach holes 114a, 114b, and 114c are arranged in an interleaved manner, and the first breach holes 114a, 114b, and 114c are arranged along a second direction D2, and the first direction D1 is not parallel to the second direction D2. In this embodiment, the first direction D1 is perpendicular to the second direction D2. Specifically, each of the first heat-dissipating fins 110 has two first edges L11 and two second edges L12 connecting the two first edges L11. In this embodiment, each of the first heat-dissipating fins 110 is, for example, a rectangle, and the first edge L11 may be a long edge of the rectangle, and the second edge L12 may be a short edge of the rectangle. In other embodiments, the first heat-dissipating fins may be, for example, a square, and the first edge and the second edge may have the same length, for example. The two first breach holes 114a and 114b of the first breach holes 114a, 114b, and 114c are respectively closer to the two second edges L12 (for example, short edges of a rectangular) than the first vias 112, and the breach hole area of the two first breach holes 114a and 114b is larger than the breach hole area of the first breach hole 114c.

Next, referring to FIG. 2D, each of the second heat-dissipating fins 120 of this embodiment has a plurality of second vias 122 and a plurality of second breach holes 124a, 124b, and 124c. The second vias 122 and the second breach holes 124a, 124b, and 124c are arranged in an interleaved manner, and the second breach holes 124a, 124b, and 124c are arranged along the second direction D2, and the second vias 122 respectively correspond to the first vias 112 of the first heat-dissipating fins 110. Specifically, each of the second heat-dissipating fins 120 has two first edges L21 and two second edges L22 connecting the two first edges L21. In this embodiment, each of the second heat-dissipating fins 120 is, for example, a rectangle, and the shape may correspond to the first heat-dissipating fins 110, and the first edge L21 may be a long edge of a rectangular, and the second edge L22 may be a short edge of the rectangular. In other embodiments, each of the second heat-dissipating fins may be, for example, a square, and the first edge and the second edge may have the same length, for example. The two second breach holes 124a, and 124b of the second breach holes 124a, 124b, and 124c are respectively closer to the two second edges L22 than the second via 122, and the breach hole area of the two second breach holes 124a, 124b is larger than the breach hole area of the second breach hole 124c.

Referring to FIGS. 2B, 2C and 2D, the heat pipe 130 of this embodiment is considers to pass through the first vias 112 of the first heat-dissipating fins 110 and the second vias 122 of the second heat-dissipating fins 120 along the first direction D1. In particular, any first breach hole 114a, 114b, and 114c forms an orthogonal projection on the second heat-dissipating fins 120 along the first direction D1, and the position of this orthogonal projection and the position of any corresponding second breach hole 124a, 124b, and 124c among the second breach holes 124a, 124b, and 124c do not overlap and are arranged in symmetry. Each of the first breach holes 114a, 114b, and 114c has a first breach hole shape, and each of the second breach holes 124a, 124b, and 124c has a second breach hole shape, and the first breach hole shape and the second breach hole shape respectively have directionality. Here, the first breach hole shape and the second breach hole shape are mirrored with respect to a connecting line L connecting the heat pipes 130. In other embodiments, the first breach hole shape and the second breach hole shape may be an asymmetrical shape with respect to the connecting line L connecting the heat pipes 130. The positions of the orthogonal projections of the first breach holes 114a, 114b, and 114c on the second heat-dissipating fin 120 along the first direction D1 and the positions of the corresponding second breach holes 124a, 124b, and 124c among the second breach holes 124a, 124b, and 124c are arranged in symmetry with respect to the connecting line L connecting the heat pipes 130. Preferably, the width of the first breach hole shapes of the first breach holes 114a, 114b, and 114c and the width of the second breach hole shapes of the second breach holes 124a, 124b, and 124c gradually increase toward the connecting line L connecting the heat pipes 130. In other words, the width of the first breach hole shapes and the width of the second breach hole shapes gradually decrease from a position closer to the connecting line L to a position farther from the connecting line L. The above-mentioned width refers to the length of each break hole in the second direction D2.

Since the first breach hole shapes of the first breach holes 114a, 114b, and 114c of the embodiment and the second breach hole shapes of the second breach holes 124a, 124b, and 124c are respectively geometric shapes and may be symmetrical or asymmetrical, when the air flow generated by the fan in projection device 10 passes through the heat-dissipating fins of the heat-dissipating module 100, the flow velocity may be reduced. When the air flow flows parallel to the heat pipes 130, through the first breach holes 114a, 114b, and 114c on the first heat-dissipating fins 110 and the second breach holes 124a, 124b, and 124c on the second heat-dissipating fins 120, additional air flow conduction paths may be created; that is, the first breach holes 114a, 114b, and 114c and the second breach holes 124a, 124b, and 124c are located between the heat pipes 130, reduce the sudden increase in flow resistance caused by the obstruction of the heat pipes 130, and effectively reduce the flow resistance. In addition, the first breach holes 114a and 114b close to the second edge L12 on the first heat-dissipating fins 110 and the second breach holes 124a and 124b close to the second edge L22 on the second heat-dissipating fins 120 are provided with larger breach hole areas, and after the first heat-dissipating fins 110 and the second heat-dissipating fins 120 with the first breach holes 114a, 114b, and 114c and the second breach holes 124a, 124b, and 124c are disposed in sequence, turbulence may be increased and the boundary layer may be damaged, thereby increasing the surface heat convection coefficient of the heat-dissipating fins and taking away more heat.

In short, in the design of the heat-dissipating module 100 of this embodiment, since the first heat-dissipating fins 110 and the second heat-dissipating fins 120 respectively have the design of the first breach holes 114a, 114b, and 114c and the second breach holes 124a, 124b, and 124c, when the air flow passes through the heat-dissipating fins, additional air flow conduction paths may be created, so that under a system state of the same heat and fan speed, the flow resistance is reduced and the flow rate is increased, thereby improving the heat-dissipation efficiency of the heat-dissipating module 100 of this embodiment. In addition, when the projection device 10 of the heat-dissipating module 100 of this embodiment is being used, because of the design of the heat-dissipating fins' break holes and vias, heat-dissipation efficiency may be improved and a lightweight projection device may be achieved.

It is to be noted that the following embodiments use the element label and part of the content of the aforementioned embodiment, and a same label is used to represent same or similar elements, and the description of the same technical content is omitted. The aforementioned embodiment may be referred to for the descriptions of the omitted parts, and the following embodiments will not be repeat those descriptions.

Figure 3B:
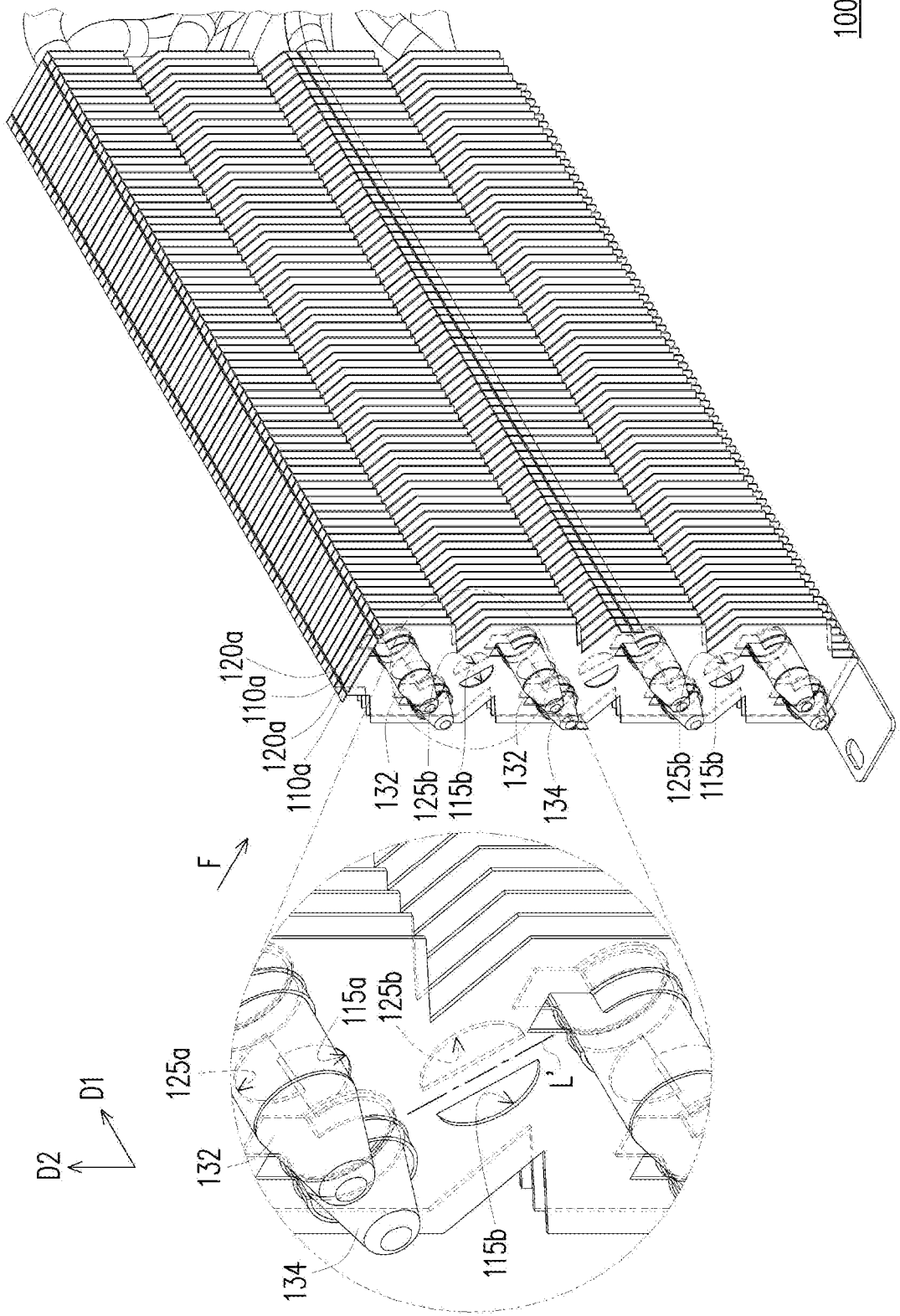
FIG. 3B is a schematic perspective view of a portion of the heat-dissipating module of FIG. 3A.
Figure 3D:
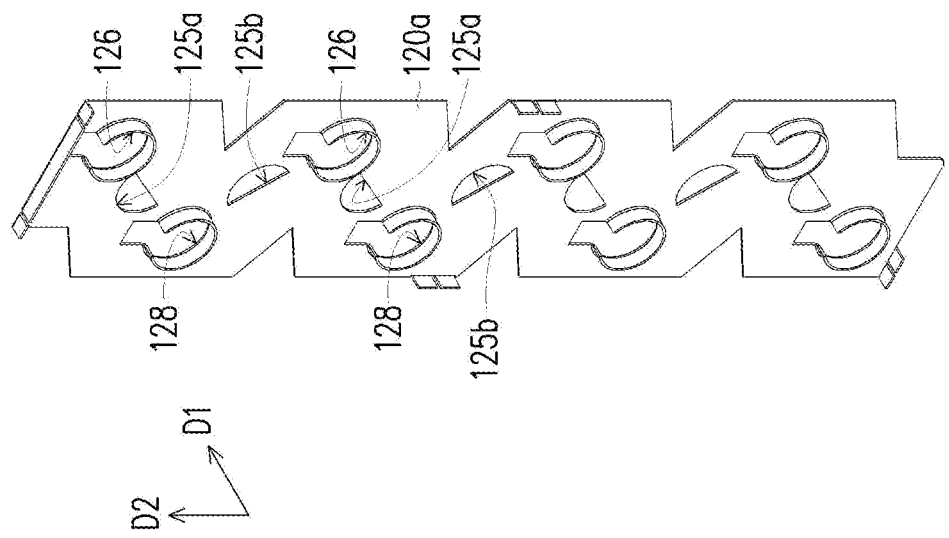
FIG. 3D is a schematic perspective view of a second heat-dissipating fin of the heat-dissipating module in FIG. 3A.
Figure 3C:
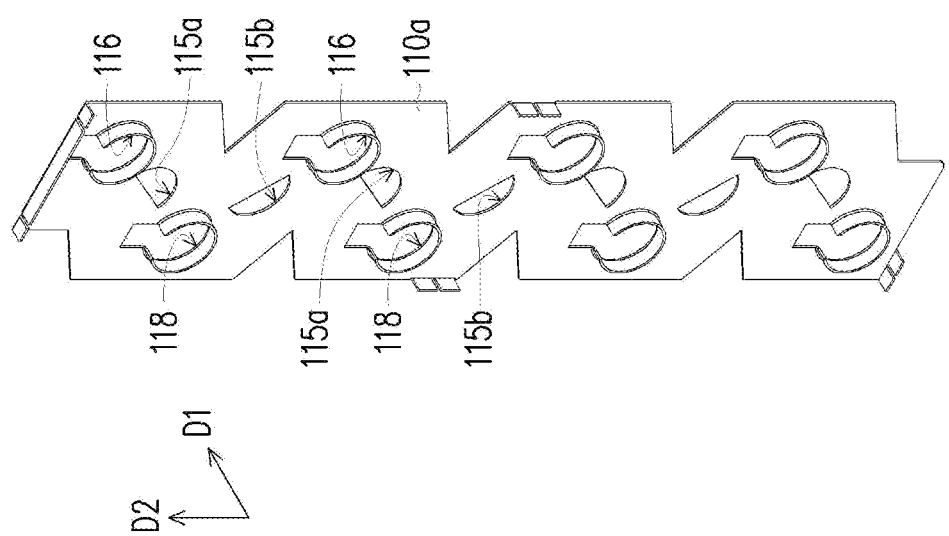
FIG. 3C is a schematic perspective view of a first heat-dissipating fin of the heat-dissipating module of FIG. 3A.

FIG. 3A is a schematic perspective view of a heat-dissipating module according to another embodiment of the invention. FIG. 3B is a schematic perspective view of a portion of the heat-dissipating module of FIG. 3A. FIG. 3C is a schematic perspective view of a first heat-dissipating fin of the heat-dissipating module of FIG. 3A. FIG. 3D is a schematic perspective view of a second heat-dissipating fin of the heat-dissipating module in FIG. 3A. Referring to FIGS. 2A, 2B, 3A, and 3B, a heat-dissipating module 100a of this embodiment is similar to the heat-dissipating module 100 of FIG. 2A, and the difference between the two is: heat pipes 132 and 134 of this embodiment are arranged in two rows in the second direction D2, and the design of first heat-dissipating fins 110a and second heat-dissipating fins 120a is different from the above-mentioned design of the first heat-dissipating fins 110 and the second heat-dissipating fins 120.

Specifically, in the heat-dissipating module 100a of this embodiment, as shown in FIG. 3C, each of the first heat-dissipating fins 110a has a plurality of first vias 116 and 118 and a plurality of first breach holes 115a and 115b, and the first vias 116 and 118 and the first breach holes 115a and 115b are arranged in an interleaved manner. As shown in FIG. 3D, each of the second heat-dissipating fins 120a has a plurality of second vias 126 and 128 and a plurality of second breach holes 125a and 125b. The second vias 126 and 128 and the second breach holes 125a and 125b are arranged in an interleaved manner, and the second vias 126 and 128 respectively correspond to the first vias 116 and 118 of the first heat-dissipating fins 110a.

Next, referring to FIGS. 3B, 3C, and 3D, the heat pipe 132 of this embodiment is configured to pass through the first vias 116 of the first heat-dissipating fins 110a and the second vias 126 of the second heat-dissipating fins 120a along the first direction D1, and the heat pipe 134 is configured to pass through the first vias 118 of the first heat-dissipating fins 110a and the second vias 128 of the second heat-dissipating fins 120a along the first direction D1, and the first vias 116 and the first vias 118 are arranged adjacent to each other in two rows in the second direction D2. In particular, any first breach hole 115a forms an orthogonal projection on the second heat-dissipating fins 120a along the first direction D1. The position of this orthogonal projection and the position of the corresponding second breach hole 125a partially overlap, and the above two are arranged in symmetry. That is, the orthogonal projection position of the first breach hole 115a of the first heat-dissipating fin 110a on the second heat-dissipating fin 120a and the position of the second breach hole 125a partially overlap.

Referring to FIG. 3B again, any first breach hole 115b forms an orthogonal projection on the second heat-dissipating fins 120a along the first direction D1. The position of the orthogonal projection and the position of the corresponding second breach hole 125b do not overlap, and the above two are arranged in symmetry. In other words, the orthogonal projection position of the first breach hole 115b of the first heat-dissipating fin 110a on the second heat-dissipating fin 120a and the position of the second breach hole 125b do not overlap. In addition, the first breach hole shape of the first breach hole 115b and the second breach hole shape of the second breach hole 125b are mirrored with respect to a connecting line L' connecting two adjacent heat pipes 132 and 134, and the position of this orthogonal projection and the position of the corresponding second breach hole 125b are arranged in symmetry with respect to the connecting line L' connecting the two adjacent heat pipes 132 and 134. In other embodiments, the first breach hole shape and the second breach hole shape may be an asymmetrical shape with respect to the connecting line L' connecting the two adjacent heat pipes 132 and 134.

Here, the width of the first breach hole shapes of the first breach holes 115a and 115b and the width of the second breach hole shapes of the second breach holes 125a and 125b gradually increase toward the connecting line L' connecting the two adjacent heat pipes 132 and 134. In other words, the width of the first breach hole shapes and the width of the second breach hole shapes gradually decrease from a position closer to the connecting line L' to a position farther from the connecting line U. Since the first breach hole shapes 115a and 115b of this embodiment and the second breach hole shapes 125a and 125b are respectively geometric shapes, when the air flow generated by the fan in projection device 10 passes through the, the flow velocity may be reduced.

In addition, the first breach holes 115a and 115b and the second breach holes 125a and 125b of this embodiment are staggered; that is, an airflow F has to enter the second breach holes 125a and 125b in a staggered manner after entering the first breach holes 115a and 115b. The above staggered holes has the effect of damaging the secondary boundary layer to increase turbulence and allowing the air flow pass through. Further, the shrinking of the cross-sectional area of air flow path caused by the obstruction of the heat pipes 132 and 134 may also be slightly alleviated. In short, with the design of the first breach holes 115a and 115b of the first heat-dissipating fins 110a and the second breach holes 125a and 125b of the second heat-dissipating fins 120a, flow resistance may be reduced and flow rate may be increased under the same heat and fan speed. Also, the staggered first breach holes 115a and 115b and second breach holes 125a and 125b may increase the turbulence to increase the convection coefficient and improve heat-dissipation effect.

Figure 4A:
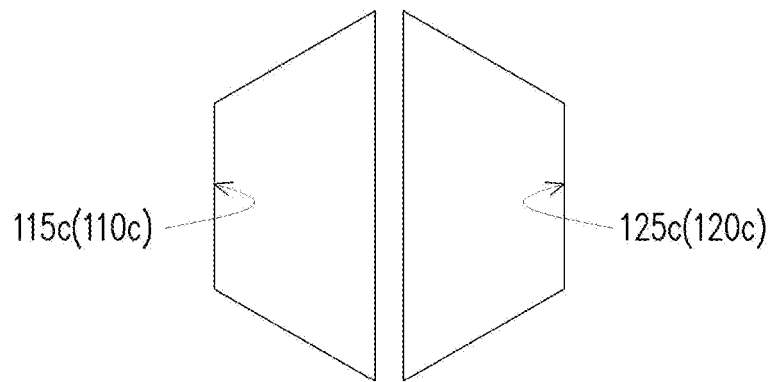
FIGS. 4A to 4C are schematic views of first breach holes of first heat-dissipating fins and second breach holes of second heat-dissipating fins according to multiple embodiments of the invention.
Figure 4B:
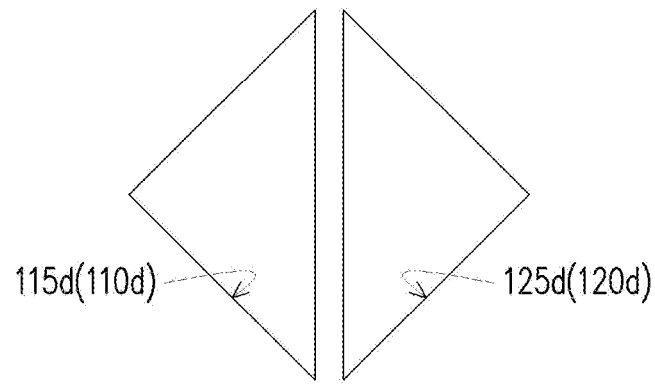
Figure 4C:
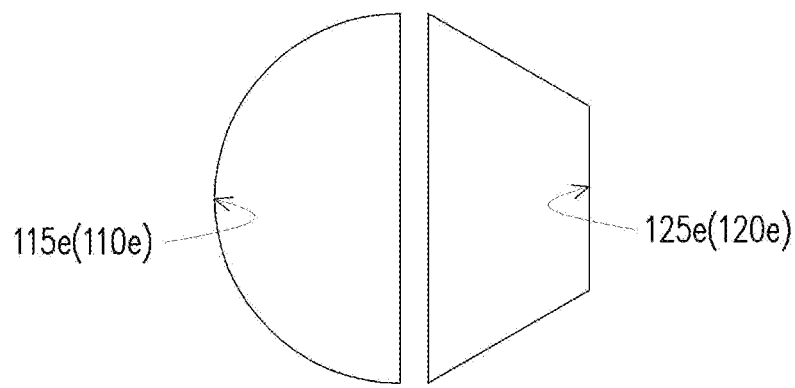

It is to be noted that in the above-mentioned embodiment, the first breach hole shape is the same as the second breach hole shape and the above two are arranged in symmetry, but the invention is not limited thereto. FIGS. 4A to 4C are schematic views of first breach holes of first heat-dissipating fins and second breach holes of second heat-dissipating fins according to multiple embodiments of the invention. Referring to FIG. 4A first, the first breach hole shape of a first breach hole 115c of a first heat-dissipating fin 110c is the same as the second breach hole shape of a second breach hole 125c of a second heat-dissipating fin 120c. Here, the first breach hole shape and the second breach hole shape are both trapezoidal and are mirrored by each other.

Referring to FIG. 4B, a first breach hole shape of a first breach hole 115d of a first heat-dissipating fin 110d is the same as the second breach hole shape of a second breach hole 125d of a second heat-dissipating fin 120d. Here, the first breach hole shape and the second breach hole shape are both triangular and mirrored.

Referring to FIG. 4C, the first breach hole shape of a first breach hole 115e of a first heat-dissipating fin 110e is different from the second breach hole shape of a second breach hole 125e of a second heat-dissipating fins 120e. Here, the first breach hole shape is asymmetrical to the second breach hole shape, the first breach hole shape is semicircular, and the second breach hole shape is trapezoidal.

That is to say, the embodiment is not limited to the first breach hole shape and the second breach hole shape being symmetrical patterns. As long as the width of the shape of the breach hole gradually decreases from a position closer to the connecting line connecting the heat pipes to a position farther from the connecting line, the above belongs to the scope of the invention. In addition, the width of the breach hole that gradually increases and decreases is not limited to being perpendicular to the connecting direction of the heat pipes. As long as the range is within 60 degrees to 120 degrees, that is, the width is perpendicular to the component of the connecting direction of the heat pipes, the efficacy of the invention may be achieved.

In summary, the invention's embodiments at least have one of the following advantages or effects. In the design of the heat-dissipating module of the invention, the first heat-dissipating fins and the second heat-dissipating fins respectively have the design of first breach holes and second breach holes. Any first breach hole forms an orthogonal projection on the second heat-dissipating fins along the first direction, and the position of the orthogonal projection and the position of the corresponding second breach hole do not overlap or partially overlap and are arranged in symmetry. In this way, when air flow passes through the heat-dissipating fins, the conduction path of the air flow may be created, so that the flow resistance is reduced and the flow rate is increased under the system state of the same heat and fan speed, thereby improving the efficiency of heat-dissipation of the heat-dissipating module of the invention. In addition, when the projection device of the heat-dissipating module of this embodiment is being used, because of the design of the heat-dissipating fins' break holes and vias, heat-dissipation efficiency may be improved and a lightweight projection device may be achieved.

The foregoing description of the preferred of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A heat-dissipating module, wherein the heat-dissipating module comprises a plurality of heat-dissipating fins and a plurality of heat pipes, wherein the heat-dissipating fins comprise a plurality of first heat-dissipating fins and a plurality of second heat-dissipating fins, and the first heat-dissipating fins and the second heat-dissipating fins are disposed in an interleaved manner and are spaced apart from each other and arranged in parallel along a first direction;

each of the first heat-dissipating fins has a plurality of first vias and a plurality of first breach holes, and the first vias and the first breach holes are arranged in an interleaved manner, wherein the first breach holes are arranged along a second direction, and the first direction is not parallel to the second direction;

each of the second heat-dissipating fins has a plurality of second vias and a plurality of second breach holes, and the second vias and the second breach holes are arranged in an interleaved manner, wherein the second breach holes are arranged along the second direction, and the second vias respectively correspond to the first vias of the first heat-dissipating fins;

the heat pipes are configured to pass through the first vias of the first heat-dissipating fins and the second vias of the second heat-dissipating fins along the first direction; and any of the first breach holes forms an orthogonal projection on the second heat-dissipating fins along the first direction, and a position of the orthogonal projection and a position of the corresponding second breach hole in the second breach holes are not overlapped or are partially overlapped, and are arranged in symmetry.

2. The heat-dissipating module according to claim 1, wherein each of the first heat-dissipating fins has two first edges and two second edges connecting the two first edges, two first breach holes in the first breach holes are respectively closer to the two second edges than the first vias, and a breach hole area of the two first breach holes are larger than a breach hole area of other first breach holes in the first breach holes.

3. The heat-dissipating module according to claim 1, wherein each of the second heat-dissipating fins has two first edges and two second edges connecting the two first edges, two second breach holes in the second breach holes are respectively closer to the two second edges than the second vias, and a breach hole area of the two second breach holes are larger than a breach hole area of other second breach holes in the second breach holes.

4. The heat-dissipating module according to claim 1, wherein each of the first breach holes has a first breach hole shape, each of the second breach holes has a second breach hole shape, and the first breach hole shape and the second breach hole shape respectively have directionality.

5. The heat-dissipating module according to claim 4, wherein the first breach hole shape and the second breach hole shape are mirrored with respect to a connecting line connecting the heat pipes, and the position of the orthogonal projection and the position of the corresponding second breach hole in the second breach holes are arranged in symmetry with respect to the connecting line connecting the heat pipes.

6. The heat-dissipating module according to claim 5, wherein the first breach hole shape and the second breach hole shape have a width that gradually increases toward the connecting line connecting the heat pipes.

7. The heat-dissipating module according to claim 4, wherein the first breach hole shape and the second breach hole shape are mirrored with respect to a connecting line connecting two of the heat pipes that are adjacent to each other, and the position of the orthogonal projection and the position of the corresponding second breach hole in the second breach holes are arranged in symmetry with respect to the connecting line connecting the two of the heat pipes that are adjacent to each other.

8. The heat-dissipating module according to claim 7, wherein the first breach hole shape and the second breach hole shape have a width that gradually increases toward the connecting line connecting the two of the heat pipes that are adjacent to each other.

9. The heat-dissipating module according to claim 4, wherein the first breach hole shape is different from the second breach hole shape.

10. The heat-dissipating module according to claim 1, wherein the positions of the orthogonal projections of the first breach holes of the first heat-dissipating fins on the second heat-dissipating fins and the positions of the second breach holes partially overlap.

11. A projection device, wherein the projection device comprises a case, a light source, an optical engine module, and a heat-dissipating module, wherein the light source and the optical engine module are disposed in the case, the optical engine module comprises a light valve and a projection lens, the light source is configured to provide an illumination light beam to the optical engine module, the light valve is disposed on a transmission path of the illumination light beam and is configured to convert the illumination light beam into an image beam, and the projection lens is disposed on a transmission path of the image beam and is configured to project the image beam to the outside of the projection device;

the heat-dissipating module is disposed in the case, and the heat-dissipating module comprises a plurality of heat-dissipating fins and a plurality of heat pipes, wherein the heat-dissipating fins comprise a plurality of first heat-dissipating fins and a plurality of second heat-dissipating fins, and the first heat-dissipating fins and the second heat-dissipating fins are disposed in an interleaved manner and are spaced apart from each other and arranged in parallel along a first direction;

each of the first heat-dissipating fins has a plurality of first vias and a plurality of first breach holes, and the first vias and the first breach holes are arranged in an interleaved manner, wherein the first breach holes are arranged along a second direction, and the first direction is not parallel to the second direction;

each of the second heat-dissipating fins has a plurality of second vias and a plurality of second breach holes, and the second vias and the second breach holes are arranged in an interleaved manner, wherein the second breach holes are arranged along the second direction, and the second vias respectively correspond to the first vias of the first heat-dissipating fins;

the heat pipes are configured to pass through the first vias of the first heat-dissipating fins and the second vias of the second heat-dissipating fins along the first direction; and any of the first breach holes forms an orthogonal projection on the second heat-dissipating fins along the first direction, and a position of the orthogonal projection and a position of the corresponding second breach hole in the second breach holes are not overlapped or are partially overlapped, and are arranged in symmetry.

12. The projection device according to claim 11, wherein each of the first heat-dissipating fins has two first edges and two second edges connecting the two first edges, two first breach holes in the first breach holes are respectively closer to the two second edges than the first vias, and a breach hole area of the two first breach holes are larger than a breach hole area of other first breach holes in the first breach holes.

13. The projection device according to claim 11, wherein each of the second heat-dissipating fins has two first edges and two second edges connecting the two first edges, two second breach holes in the second breach holes are respectively closer to the two second edges than the second vias, and a breach hole area of the two second breach holes are larger than a breach hole area of other second breach holes in the second breach holes.

14. The projection device according to claim 11, wherein each of the first breach holes has a first breach hole shape, each of the second breach holes has a second breach hole shape, and the first breach hole shape and the second breach hole shape respectively have directionality.

15. The projection device according to claim 14, wherein the first breach hole shape and the second breach hole shape are mirrored with respect to a connecting line connecting the heat pipes, and the position of the orthogonal projection and the position of the corresponding second breach hole in the second breach holes are arranged in symmetry with respect to the connecting line connecting the heat pipes.

16. The projection device according to claim 15, wherein the first breach hole shape and the second breach hole shape have a width that gradually increases toward the connecting line connecting the heat pipes.

17. The projection device according to claim 14, wherein the first breach hole shape and the second breach hole shape are mirrored with respect to a connecting line connecting two of the heat pipes that are adjacent to each other, and the position of the orthogonal projection and the position of the corresponding second breach hole in the second breach holes are arranged in symmetry with respect to the connecting line connecting the two of the heat pipes that are adjacent to each other.

18. The projection device according to claim 17, wherein the first breach hole shape and the second breach hole shape have a width that gradually increases toward the connecting line connecting the two of the heat pipes that are adjacent to each other.

19. The projection device according to claim 14, wherein the first breach hole shape is different from the second breach hole shape.

20. The projection device according to claim 11, wherein one end of the heat pipes of the heat-dissipating module is connected to the heat-dissipating fins, and another end of the heat pipes of the heat-dissipating module is connected to the light source or the optical engine module.

* * * * *